United States Patent [19]

Seidler et al.

[11] 3,852,644

[45] Dec. 3, 1974

[54] PRINTED WIRING CIRCUIT GUARD RING

[75] Inventors: Helmut G. Seidler, Schwenksville; James T. Walker, Norristown, both of Pa.

[73] Assignee: Philco-Ford Corporation, Blue Bell, Pa.

[22] Filed: June 22, 1973

[21] Appl. No.: 372,593

[52] U.S. Cl. .................... 317/101 C, 317/12

[51] Int. Cl. .................... H05k 5/00

[58] Field of Search ......... 317/246, 12 R, 10, 101 C

[56] References Cited

UNITED STATES PATENTS 3,387,208 6/1968 Foley .................... 317/12 R

*Primary Examiner*—David Smith, Jr.

*Attorney, Agent, or Firm*—Robert D. Sanborn; Gail W. Woodward

[57] ABSTRACT

When a conventional printed wiring board is subjected to a harsh environment, leakage can develop between adjacent conductors over a period of time. If high impedance circuits are employed on the board, such leakage can adversely affect circuit performance. The effect of such leakage can be minimized if the circuit layout is so arranged that potentially troublesome leakage occurs only to elements that operate at comparable operating potentials. In one embodiment of the invention, a circuit is shown having a high impedance point on a printed wiring board intended for an automotive application. The high impedance wiring conductor is completely surrounded by a metal conductor that is connected to a potential point in the circuit that approximates the potential at which the high impedance point will operate. When the automotive environment results in surface leakage, there will be very little change in the operational character of the high impedance circuit.

2 Claims, 2 Drawing Figures

PATENTED DEC 3 1974 3,852,644

PRINTED WIRING CIRCUIT GUARD RING

BACKGROUND OF THE INVENTION

The conventional printed wiring (PW) circuit board has proven to be an excellent interconnection medium for solid state circuits. Using this approach high reliability at low cost has been achieved for a wide variety of electronic circuit functions. PW circuit boards are ordinarily quite stable and durable, but problems can develop when they are used in harsh ambients. In automotive applications the conditions within the engine compartment are extreme. These include large temperature variations, exposure to corrosive fumes and exposure to moisture. When the equipment is located inside the automobile passenger compartment, the severity of the environment is greatly reduced, but substantial problems still exist. Circuit boards are still subjected to high humidity and corrosive atmosphere conditions along with substantial temperature extremes.

The combination of moisture with corrosive fumes constitutes a particularly severe problem because it can create conductive paths on insulating surfaces. This means that conductive paths exist where none are desired. This is most troublesome in high impedance circuits. Ordinarily solid state circuits operate at low impedance levels and are relatively tolerant of moderate leakage. However, in some applications high impedance circuits are called for and these constitute a special problem.

One solution to the problem is to hermetically seal the circuit board inside a suitable housing. This approach is expensive and vitiates some of the advantages of PW. Another solution is to spray coat the circuit board with a protective film or coating of a suitable plastic. This is helpful but does not completely solve the problem.

In recent years electronically operated automatic speed control devices have been developed and are being used in increasing numbers. These devices employ high impedance circuits which are subject to the potential leakage problem to which the present invention is directed. A typical state of the art speed control system is shown in U.S. Pat. No. 3,455,411, issued July 15, 1969. Speed control is achieved by comparing an analog voltage proportional to speed with a reference voltage. Any departure from a desired difference causes the automobile accelerator to be operated to reduce the departure. This constitutes a servomechanism that acts to hold vehicle speed relatively constant.

Electronically the reference voltage is a charge on a high quality dielectric capacitor. Very little leakage can be tolerated because the reference voltage must be kept constant for extended time periods. The circuit for comparing the reference voltage with the speed analog voltage must not discharge the capacitor and therefore must be a high impedance circuit. By way of example, if the reference voltage is stored in a 0.01 microfarad capacitor and the voltage is not allowed to vary more than 1 percent over a one hour interval, a time constant interval of over 6,000 seconds is required. For the above capacitor a resistance on the order of $6 \times 10^{11}$ ohms or 600,000 megohms is required. This high resistance is ordinarily achieved by using an insulated gate type of transistor and special wiring and shielding techniques.

Other portions of the speed control circuit operate at substantially lower resistance values. For example a 30 megohm resistor is employed in the accelerate circuit. Reliable operation of this circuit requires that leakage values of in excess of 3,000 megohms be maintained. Such values are quite difficult to maintain on commercially produced products used over long periods of time in the automotive environment. It is to this latter problem that the present invention is directed.

SUMMARY OF THE INVENTION

It is an object of the invention to reduce the effect of surface leakage between conductors on PW circuit boards.

It is a further object of the invention to provide high impedance PW circuit connections with means for reducing the loading effects of surface leakage.

It is a still further object of the invention to isolate high impedance points on a PW circuit board by surrounding them with metal conductors that interrupt surface leakage thereto.

These and other objects are achieved as outlined in the following description. The high impedance points on a PW circuit board are individually surrounded with a closed ring of conductive material. This ring can be a separate conductor or in the interest of economy it can be part of the regular wiring. The ring is connected to a source of d-c potential that approximates the operating potential of the high impedance point. Thus even though some surface leakage develops the leakage will not alter the potential at the protected point to the degree that uncontrolled leakage would produce.

In a typical embodiment of the invention in an automatic speed control circuit, a high impedance point is surrounded with a conductor ring that is connected to the reference source potential which represents the d-c voltage level that the high impedance point will normally achieve. This action in practice constitutes a safety feature. If the high impedance point were to develop uncontrolled leakage to a point of substantially different potential, the speed control circuit could malfunction to result in excessive accelerations of the vehicle.

DESCRIPTION OF THE INVENTION

Figure 1:
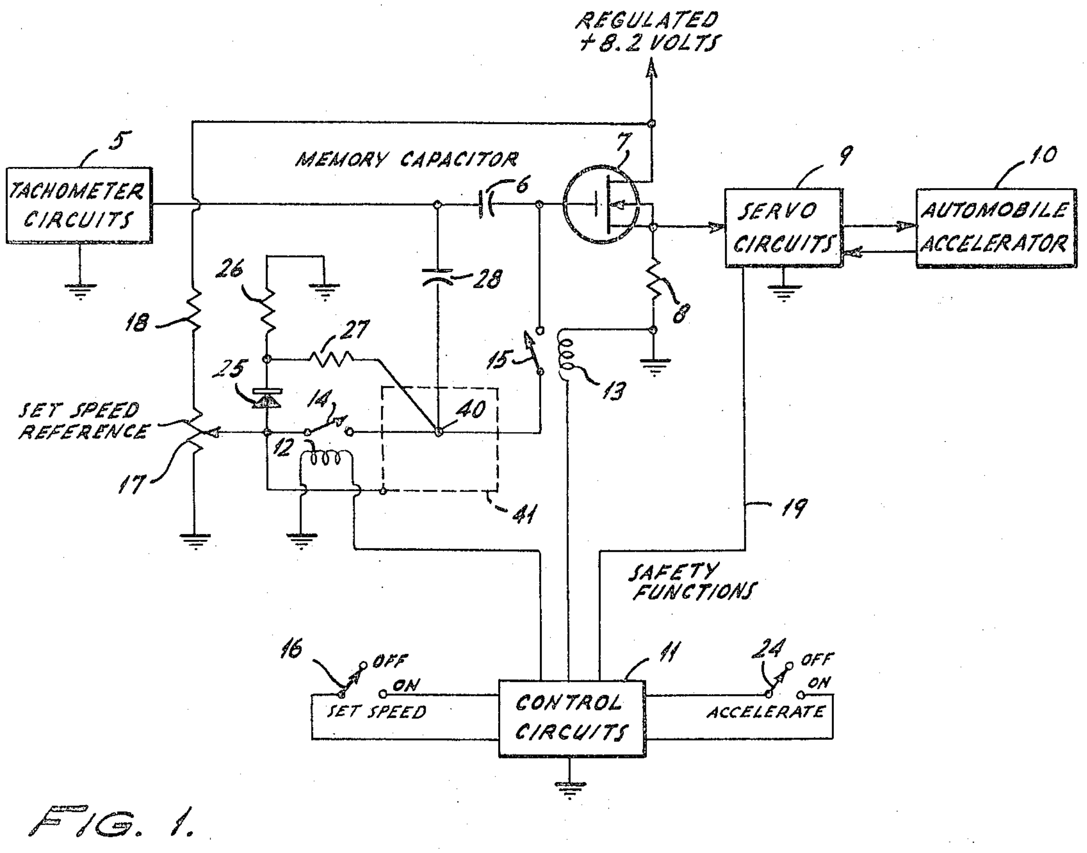
FIG. 1 is a partial schematic block diagram of an electronic speed control device of the type generally taught in the above-referred U.S. Pat. No. 3,455,411, but showing a leakage protected high impedance point in accordance with the present invention.

FIG. 1 shows the elements of a speed control circuit for use in automobiles or like vehicles. Tachometer circuits 5 are normally activated by the speedometer shaft and produce a d-c output voltage proportional to vehicle speed. Typically this value will be about 0.075 volt per mile per hour. Thus at 60 m.p.h. there will be 4.5 volts at the output of block 5. This is called the speed analog voltage.

Memory capacitor 6 couples the output of the tachometer circuits 5 to the gate of an insulated gate field effect transistor (IGFET) 7, the output of which is coupled to servo circuits 9. The servo circuits 9 provide a mechanical output which operates the automobile accelerator 10. In operation control circuits 11, which are under control of the vehicle operator, operate reed relay coils 12 and 13 which in turn actuate contacts 14 and 15 respectively when energized. These contacts are normally open as shown.

Assume that the vehicle is operating at 60 m.p.h. and that it is desired to actuate the speed control circuits to hold that speed. The operator momentarily moves SET SPEED switch 16 to its "on" position and the control circuits momentarily energize relay coils 12 and 13. While the relays are energized, the right hand terminal of capacitor 6 is connected to a positive potential established at the arm of potentiometer 17. This potentiometer is present in the circuit to provide a means for compensating circuit component tolerances. It is adjusted, after the circuit is assembled, to provide for a predetermined overall system response to a particular input speed analog voltage. This avoids the need for excessively strict component values and/or parts selection. Together with resistor 18 potentiometer 17 forms a voltage divider connected across the regulated 8.2 volt supply. While not shown this regulated supply is conveniently obtained by means of a zener diode in conjunction with a dropping resistor and the automobile 12-volt battery circuit. The midpoint on potentiometer 17 will develop about 2 volts. Assuming that this setting is being used, the right hand terminal of capacitor 6 is at 2 volts while the left hand terminal is at 4.5 volts due to the tachometer output. Thus capacitor 6 will charge to 2.5 volts. After their brief on period, during which capacitor 6 charges, the control circuits de-energize relay coils 12 and 13 thereby opening contacts 14 and 15. At this point the voltage on the base of IGFET 7 will be 2 volts (the tachometer output less the charge on capacitor 6.) This will, due to IGFET conduction, produce a voltage across resistor 8 and this in turn will operate servo circuits 9 which in turn operate accelerator 10.

In an actual circuit the servo circuits are quite complex and the accelerator control function very sophisticated. Since the invention is unrelated to this complexity, the complex circuits and functions will not be shown or described in detail. Only the basic action will be described.

If the vehicle speed were to increase, for example due to a downgrade, the tachometer circuits will produce a greater output voltage. Since capacitor 6 retains its original charge the voltage at the gate of IGFET 7 will go more positive and a greater voltage will be developed across resistor 8. This will, through the servo circuits 9 action, pull the accelerator 10 back thereby reducing power to the automobile drive system so as to maintain the 60 m.p.h. speed. Conversely, if the vehicle speed were to decrease, for example due to an upgrade, the tachometer circuits 5 will produce less output and the IGFET 7 gate voltage will decrease. This reduces the voltage across resistor 8 and the servo circuits 9 cause the accelerator 10 to be depressed thereby applying more power to the automobile drive so that the desired speed is maintained.

The control circuits 11 may also provide a number of safety functions by way of line 19. For example the control circuits will disable the speed control operation if the actual speed departs excessively from the desired speed or if the brake is actuated. These functions too are not crucial to the invention and will not be shown or described in detail.

From the above it can be seen that memory capacitor 6 is critical. It must hold the charge applied to it when the speed control circuits are actuated. This charge acts as the electrical reference against which the tachometer circuits 5 output is compared. If the charge on capacitor 6 were to leak off, the vehicle speed under speed control would vary. Accordingly capacitor 6 is specified as a high quality low leakage device. Typically it will employ polystyrene or Teflon (polytetrafluoroethylene) as the dielectric medium and will be carefully manufactured to avoid surface leakage. In addition the wiring associated with the right hand terminal must be as completely free of leakage as possible. This is why an IGFET is used as the comparison device. In actual practice, capacitor 6, reed relay contacts 15, and IGFET 7 are all mounted inside a shielded enclosure and preferably covered with an insulating plastic coating. The gate electrode of IGFET 7 and the right hand terminal of capacitor 6 are disassociated from the ordinary PW board and they are connected in free standing form to the reed relay contact terminal. Thus PW board leakage does not have any effect on the charge on capacitor 6.

Switch 24 is an "accelerate" switch that operates the speed control system to cause the vehicle to accelerate at a controlled rate while the speed regulating function is operative. Diode 25 and resistor 26 are connected from the arm of potentiometer 17 to ground. Since the diode is a silicon device and is forward biased, and, since resistor 26 is much larger than potentiometer 17, the voltage of the left hand terminal of resistor 27 will be about 0.6 volt below the voltage at the arm of potentiometer 17.

When accelerate switch 24 is actuated to its "on" position it establishes a particular mode of operation in control circuits 11. Elements present in control circuits 11 cause it to respond to accelerate switch 24 so that upon initial closure both relay contacts 14 and 15 are closed. After a brief on period contacts 14 open thereby leaving contacts 15 closed as long as switch 24 is closed. During the initial period when both relays are on, capacitor 28, which is selected to have a capacitance very large relative to that of capacitor 6, is connected in parallel with capacitor 6 and both are connected to the arm of potentiometer 17. The two capacitors will charge rapidly to the difference in potential between the tachometer circuits 5 output and that present at the arm of potentiometer 17. Assuming that the speed control had been working normally on a flat run, both capacitors will then be charged to the level to which capacitor 6 had previously charged. When contact 14 opens, following its brief commanded-on period, capacitors 6 and 28 will be connected through resistor 27 to the juncture of diode 25 and resistor 26 which is operating about 0.6 volt below the voltage at the arm of potentiometer 17. The capacitors will begin to discharge at a rate determined by the capacitor 28 - resistor 27 time constant and the differential voltage. Since all of these factors are fixed, a steady predetermined rate is assured. As the capacitors discharge the gate of IGFET 7 will be driven to a lower voltage and the vehicle will accelerate. As far as the speed control circuits are concerned, this lower voltage will act as if the vehicle had slowed for some reason.

The acceleration raises the tachometer output which will tend to charge the capacitors. Thus as the capacitors are discharged through resistor 27 the resulting acceleration will act to produce a compensating charging effect. The component values are selected in respect to the automobile performance in combination with the control circuit operation to give a desired acceleration characteristic.

When the accelerate switch 24 is turned "off" the control circuits 11 will establish a mode of operation that causes both relays to close momentarily and then revert to their normally open states. During the closed interval the speed control will be reset to the vehicle speed present at turnoff and this speed will then be maintained in the usual manner.

As a practical matter resistor 27 must be made quite large to achieve the desired time constant (and rate of acceleration). Typically a value of about 30 megohms will be used. This makes point 40 of the circuit a high impedance point. For convenience and in the interest of production economy, point 40 should be included in, and lie on the surface of, a conventional PW board circuit assembly. It can be seen that if leakage develops on the surface of the PW board the voltage at point 40 will vary at other than the rate predetermined by resistor 27 and this could result in uncontrolled speed changes when the accelerate function is in operation. Certainly the accelerate function will not operate inits intended manner if such leakage is present.

Since resistor 27 is about 30 megohms it is clear that any leakage at this point should be greater than about 300 megohms to avoid uncontrolled changes. This value is difficult to maintain on a PW board subjected to severe ambient conditions such as those encountered in the automotive situation.

Figure 2:
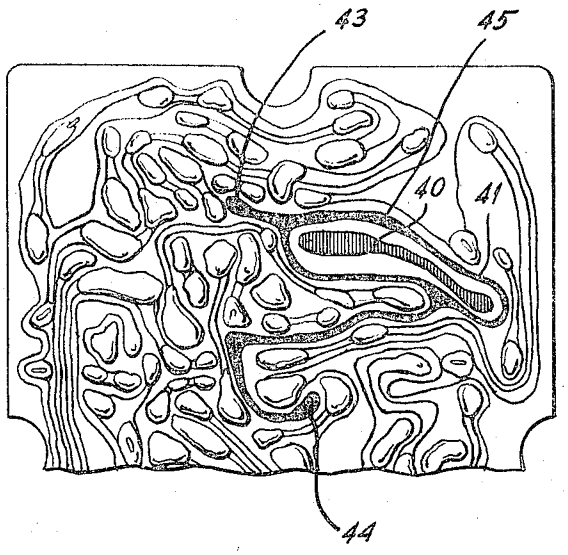
FIG. 2 is a fragmentary sketch of the printed wiring used in connection with the circuit of FIG. 1.

The leakage problem can be greatly alleviated by constructing the printed wiring about point 40 as shown in FIG. 2. This drawing shows a fragmentary portion of the PW board with point 40 indicated. This connection point is completely surrounded by a ring of wiring designated 41. This ring is connected to the arm of potentiometer 17 as can be seen in FIG. 1 where the ring 41 is represented in dashed outline. Using this shielding or guard ring type of construction, any leakage that develops to point 40 will only relate to a potential source that approximates the normal potential at point 40. As described above, the potential of point 40 will normally operate very closely to the potential at the arm of potentiometer 17. Thus a leakage resistance much lower than the postulated 300 megohms could be tolerated. In fact a leakage resistance as low as 30 megohms could probably be tolerated since its major effect would be to reduce the time constant and the magnitude of maximum acceleration in the accelerate mode of speed control operation. This is clearly preferred to an uncontrolled leakage which could result in rapid uncontrolled acceleration or even deceleration in the accelerate mode.

Wiring ring 41 could if desired be returned to a separate voltage divider designed to provide the desired potential. However returning ring 41 to the arm of potentiometer 17 has two advantages. First, a separate divider is not needed and the wiring is therefore simplified. Second, since potentiometer 17 will be set to its final value as part of the manufacturing process, its setting will automatically provide the desired voltage. For the wiring shown in FIG. 2, ring 41 is actually made a part of the regular PW. For example point 43 is physically located at the arm of potentiometer 17, point 44 is physically located at the left hand terminal of relay contacts 14, and point 45 is physically located at the anode terminal of diode 25. Thus ring 41 simultaneously isolates wiring point 40 and joins components 17, 14 and 25 together.

The following part values were used in a speed control device constructed as shown in FIGS. 1 and 2 to demonstrate the improved tolerance to leakage of the wiring form of FIG. 2.

| | |
|---|---|
| Capacitor 6 | .01 Microfarad (polystyrene) |
| IGFET 7 | MFE 3004 (Motorola) |
| Resistor 8 | 2.2 K ohms |
| Potentiometer 17 | 5 K ohms linear |
| Resistor 18 | 3.9 K ohms |
| Diode 25 | FD-100 (Fairchild) |
| Resistor 26 | 12 K ohms |
| Resistor 27 | 30 M ohms |
| Capacitor 28 | 0.12 Microfarad (Mylar) |

The device was subjected to extended testing under highly adverse conditions and was found to be much less subject to leakage than were conventionally constructed devices.

A means for substantially reducing the effects of electrical leakage on a PW board has been set forth and an example of an application has been shown. A person skilled in the art will find many other applications and equivalents. Therefore it is intended that the scope of our invention be limited only by the following claims.

We claim:

1. A printed wiring circuit board for mounting a group of electronic components and interconnecting said components to form an electronic circuit, said board comprising:

an insulating substrate, an array of conductors disposed on said substrate, said array being contoured to complete the interconnections between said components to achieve said circuit, a first conductor in said array interconnecting elements of said components to form a point operating at an impedance that is high relative to the impedance normally encountered at other points in said circuit, and a second conductor in said array adjacent to and surrounding said first conductor, said second conductor being connected to a source of potential approximating the potential at said point.

2. The device of claim 1 wherein said second conductor is additionally employed as an interconnecting element in the remainder of said array.

* * * * *